(12) United States Patent
Yamaguchi et al.

(10) Patent No.: US 10,161,031 B2
(45) Date of Patent: *Dec. 25, 2018

(54) OXIDE SINTERED COMPACT AND SPUTTERING TARGET FORMED FROM SAID OXIDE SINTERED COMPACT

(71) Applicant: JX Nippon Mining & Metals Corporation, Tokyo (JP)

(72) Inventors: Yohei Yamaguchi, Ibaraki (JP); Toshiya Kurihara, Ibaraki (JP); Koji Kakuta, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/553,379

(22) PCT Filed: Feb. 19, 2016

(86) PCT No.: PCT/JP2016/054832
§ 371 (c)(1),
(2) Date: Aug. 24, 2017

(87) PCT Pub. No.: WO2016/136611
PCT Pub. Date: Sep. 1, 2016

(65) Prior Publication Data
US 2018/0073132 A1 Mar. 15, 2018

(30) Foreign Application Priority Data
Feb. 27, 2015 (JP) .................. 2015-037734

(51) Int. Cl.
| | | |
|---|---|---|
| C04B 35/453 | (2006.01) |
| C23C 14/34 | (2006.01) |
| C01G 15/00 | (2006.01) |
| C04B 35/01 | (2006.01) |
| C04B 35/64 | (2006.01) |

(52) U.S. Cl.
CPC ........ *C23C 14/3407* (2013.01); *C01G 15/006* (2013.01); *C04B 35/01* (2013.01); *C04B 35/453* (2013.01); *C04B 35/64* (2013.01); *C23C 14/3414* (2013.01); *C01P 2002/50* (2013.01); *C01P 2002/60* (2013.01); *C01P 2006/10* (2013.01); *C01P 2006/40* (2013.01); *C04B 2235/3284* (2013.01); *C04B 2235/3286* (2013.01); *C04B 2235/604* (2013.01); *C04B 2235/6567* (2013.01); *C04B 2235/6585* (2013.01); *C04B 2235/77* (2013.01); *C04B 2235/786* (2013.01); *C04B 2235/94* (2013.01); *C04B 2235/96* (2013.01)

(58) Field of Classification Search
CPC .......................... C04B 35/453; C23C 14/3414
See application file for complete search history.

(56) References Cited

U.S. PATENT DOCUMENTS

| | | | |
|---|---|---|---|
| 6,528,442 B1 | 3/2003 | Kuwano et al. | |
| 7,674,404 B2 | 3/2010 | Osada | |
| 7,682,529 B2 | 3/2010 | Osada | |
| 7,686,985 B2 | 3/2010 | Osada | |
| 7,699,965 B2 | 4/2010 | Ikisawa et al. | |
| 8,007,693 B2 | 8/2011 | Ikisawa et al. | |
| 8,148,245 B2 | 4/2012 | Ikisawa et al. | |
| 8,623,511 B2* | 1/2014 | Kawashima | C04B 35/01 428/412 |
| 8,784,700 B2* | 7/2014 | Inoue | C04B 35/01 252/519.1 |
| 9,045,823 B2 | 6/2015 | Osada et al. | |
| 9,147,706 B2* | 9/2015 | Koyama | H01L 27/1461 |
| 2009/0197757 A1 | 8/2009 | Fukushima | |
| 2010/0108502 A1 | 5/2010 | Inoue et al. | |
| 2011/0168994 A1 | 7/2011 | Kawashima et al. | |
| 2012/0103804 A1* | 5/2012 | Ikisawa | C01G 15/006 204/298.13 |
| 2012/0118726 A1* | 5/2012 | Yano | C04B 35/01 204/192.25 |
| 2012/0228133 A1* | 9/2012 | Itose | C04B 35/01 204/298.13 |
| 2013/0320333 A1* | 12/2013 | Koyama | H01L 27/1461 257/43 |
| 2013/0341181 A1 | 12/2013 | Park et al. | |
| 2014/0158951 A1 | 6/2014 | Yamanobe et al. | |
| 2018/0065893 A1* | 3/2018 | Yamaguchi | C23C 14/3414 |

FOREIGN PATENT DOCUMENTS

| | | |
|---|---|---|
| JP | 2013-129545 A | 7/2013 |
| JP | 2014-024738 A | 2/2014 |
| JP | 2014-040348 A | 3/2014 |
| JP | 2014-105383 A | 6/2014 |
| JP | 2014-114473 A | 6/2014 |
| JP | 2014-125422 A | 7/2014 |
| JP | 2015-024944 A | 2/2015 |

* cited by examiner

*Primary Examiner* — Karl E Group
(74) *Attorney, Agent, or Firm* — Howson & Howson LLP

(57) ABSTRACT

An IGZO sintered compact composed of indium (In), gallium (Ga), zinc (Zn), oxygen (O) and unavoidable impurities, wherein the IGZO sintered compact has a flexural strength of 50 MPa or more, and a bulk resistance of 100 mΩcm or less. Provided is a sputtering target capable of suppressing the target cracks and reducing the generation of particles during deposition via DC sputtering, and forming favorable thin films.

3 Claims, 1 Drawing Sheet

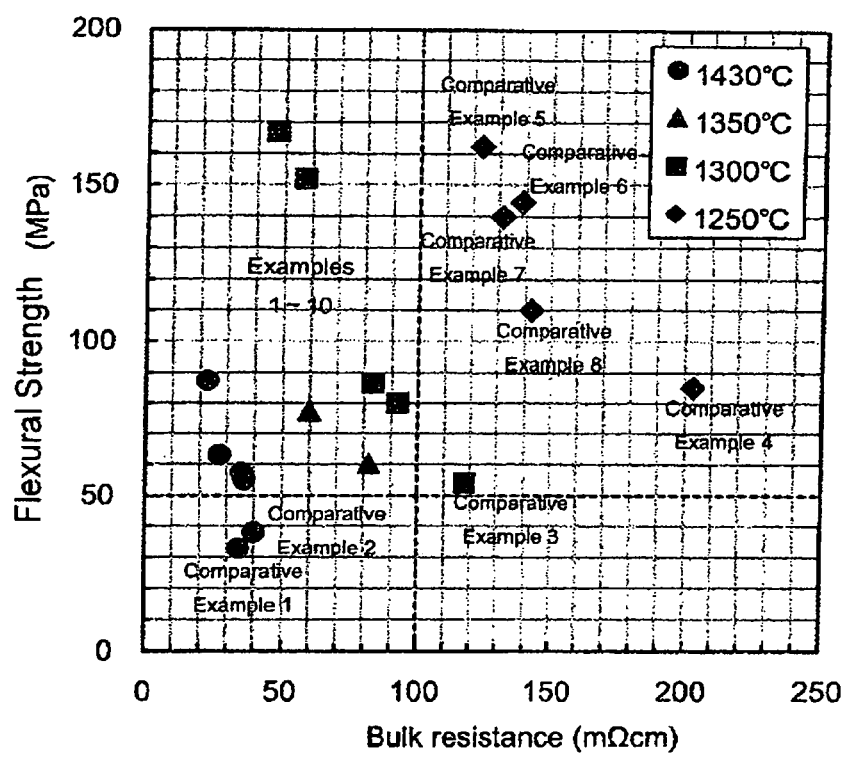

OXIDE SINTERED COMPACT AND SPUTTERING TARGET FORMED FROM SAID OXIDE SINTERED COMPACT

BACKGROUND

The present invention relates to an oxide composed of indium (In), gallium (Ga), zinc (Zn), oxygen (O), and unavoidable impurities (generally referred to as "IGZO"; and the term "IGZO" will be used in the ensuing explanation as appropriate), and particularly relates to an IGZO sintered compact and a sputtering target formed from such IGZO sintered compact.

Conventionally, α-Si (amorphous silicon) has been used for a TFT (thin film transistor) as a backplane of an FPD (flat-panel display). Nevertheless, sufficient electron mobility cannot be obtained when using α-Si. Thus, in recent years, research and development of TFT using an In—Ga—Zn—O-based oxide (IGZO), which has higher electron mobility than α-Si, is being conducted. In addition, a next-generation high-performance flat-panel display using IGZO-TFT has been partially been put into practical application, and is attracting attention.

An IGZO film is generally deposited by sputtering a target which is prepared from an IGZO sintered compact. The IGZO sintered compact includes a sintered compact having a (111) composition of In:Ga:Zn=1:1:1 (atomic ratio). Nevertheless, this sintered compact having a (111) composition has problems in that the growth of crystal grains is fast and, therefore, the adjustment of the grain size is difficult. When the crystal grain size becomes too large, cracks tend to be generated at the crystal grain boundary, and the strength of the sintered compact will considerably deteriorate.

Patent Documents 1 to 6 basically describe that, in an IGZO sintered compact having a (111) composition, the flexural strength of the sintered compact can be increased based on unique sintering methods. Specifically, in the case of using a microwave heating furnace or an electric furnace with a general-purpose resistance heater, the growth of crystal grains is inhibited and the flexural strength is increased by drastically shortening the sintering time to 1 to 2 hours. Nevertheless, the microwave heating can achieve rapid heating or short-time sintering, but there are problems in that uneven heating may arise due to local heating, and the size of the sintered compact is restricted due to the limitation in the size of the furnace, and thus this is unsuitable for mass production. Moreover, when the sintering time is drastically shortened with an electric furnace, the growth of the crystal grains can be suppressed, but the structure may become uneven between the surface part and the inside of the sintered compact, the sintered compact may be subject to warping or strains more easily, and this may lead to the considerable deterioration in the yield.

Moreover, an IGZO sintered compact is required to have a sufficiently low bulk resistance to enable stable DC sputtering. Generally speaking, when the bulk resistance is high, DC sputtering becomes difficult, and, even if DC sputtering is possible, high power needs to be input in order to attain a practical deposition rate. Furthermore, when the bulk resistance is high, the probability of the generation of an abnormal discharge will increase, and there are problems in that this may lead to an adverse effect on the film caused by the generation of particles, and the occurrence of cracks or fractures of the sputtering target. Note that the Examples in Patent Documents 1 to 6 describe that deposition was performed via DC sputtering, but there are no specific descriptions concerning the bulk resistance of the sintered compact.

CITATION LIST

Patent Documents

Patent Document 1: JP 2013-129545 A
Patent Document 2: JP 2014-040348 A
Patent Document 3: JP 2014-024738 A
Patent Document 4: JP 2014-114473 A
Patent Document 5: JP 2014-105383 A
Patent Document 6: JP 2014-125422 A

SUMMARY

An object of the present invention is to provide an IGZO oxide sintered compact having a high flexural strength and a low bulk resistance. The sputtering target formed from the IGZO oxide sintered compact can drastically reduce the target cracks and the generation of particles during deposition, and form favorable thin films.

As a result of intense study in order to achieve the foregoing object, the present inventors discovered that appropriate adjustment of the composition and sintering conditions of the IGZO sintered compact can achieve an increase in the flexural strength and a lowering in the bulk resistance of the sintered compact (sputtering target), and consequently enables favorable DC sputtering and improvement in the quality of the obtained thin film. Based on the foregoing discovery, the present inventors provide the following invention.

1) An IGZO sintered compact composed of indium (In), gallium (Ga), zinc (Zn), oxygen (O) and unavoidable impurities, wherein the IGZO sintered compact has a flexural strength of 50 MPa or more, and a bulk resistance of 100 mΩcm or less.

2) The IGZO sintered compact according to 1) above, wherein an atomic ratio of In, Ga, and Zn satisfies the following formulae:

$$0.314 \leq In/(In+Ga+Zn) \leq 0.342;$$

$$0.314 \leq Ga/(In+Ga+Zn) \leq 0.342; \text{ and}$$

$$0.325 \leq Zn/(In+Ga+Zn) \leq 0.364.$$

3) The IGZO sintered compact according to 1) or 2) above, wherein the IGZO sintered compact has an average crystal grain size of 6 to 22 μm.

4) The IGZO sintered compact according to any one of 1) to 3) above, wherein the IGZO sintered compact has a density of 6.10 g/cm$^3$ or more.

5) A plate-shaped or cylindrical sputtering target formed from the IGZO sintered compact according to any one of 1) to 4) above.

The present invention yields superior effects that both a high flexural strength and a low bulk resistance can be achieved in an IGZO sintered compact composed of indium (In), gallium (Ga), zinc (Zn), oxygen (O) and unavoidable impurities by appropriately adjusting the composition and sintering conditions of the sintered compact, and stable DC sputtering can be performed with minimal generation of particles.

BRIEF DESCRIPTION OF DRAWINGS

The FIGURE is a diagram showing a relation of the flexural strength and the balk resistance of an IGZO sintered compact.

DETAILED DESCRIPTION

The oxide sintered compact of the present invention is composed of indium (In), gallium (Ga), zinc (Zn), oxygen (O) and unavoidable impurities, and has a flexural strength (also known as modulus of rupture, bending strength, and transverse rupture strength) of 50 MPa or more and a bulk resistance of 100 mΩcm or less. When the flexural strength is less than 50 MPa, cracks may be generated in the target during sputtering. When the bulk resistance exceeds 100 mΩcm, even though DC sputtering may be possible, abnormal discharge may arise during sputtering that is performed for a long period. In some cases, a discharge may not occur in DC sputtering, and thus there is no choice but to apply RF sputtering, alternatively.

Moreover, in the present invention, the atomic ratio of In, Ga and Zn of the oxide sintered compact preferably satisfies the following formulae:

$$0.314 \leq In/(In+Ga+Zn) \leq 0.342;$$

$$0.314 \leq Ga/(In+Ga+Zn) \leq 0.342; \text{ and}$$

$$0.325 \leq Zn/(In+Ga+Zn) \leq 0.364.$$

By making the composition of an IGZO sintered compact to be Zn-rich from a (111) composition, it is possible to realize a bulk resistance which enables high mechanical strength and stable DC sputtering.

Note that the respective component amounts may vary during blending, mixing and sintering the raw material powders. For example, in cases where the intended composition is In:Ga:Zn=1:1:1, variation may arise in a range of In:Ga:Zn=1±0.02:1±0.02:1±0.02, and thus it may be out of a Zn-rich state, but such fact shall not be grounds for denying the present invention.

The oxide sintered compact of the present invention preferably has an average crystal grain size of 6 to 22 μm. The mechanical strength can be increased by causing the average grain size to fall within the foregoing numerical range. When the average grain size exceeds 22 μm, the mechanical strength will decrease and, when excessive power is input during sputtering, there is a possibility that cracks may arise in the sintered compact due to the stress caused by the difference in thermal expansion between the sputtering target (sintered compact) and the backing plate that is bonded with the target.

Meanwhile, when the average grain size is less than 6 μm, there is a possibility that the sintering will not advance sufficiently, and, with such insufficient sintering, a sufficient reaction is not realized between the respective raw materials, and the composition may become uneven, or numerous pores may become generated in the sintered compact. Furthermore, such compositional unevenness and the existence of pores will cause deterioration in the flexural strength of the sintered compact, and an increase in the variation of the flexural strength. Furthermore, the pores will cause arcing or particle generation during sputtering, and have an adverse effect on the film characteristics.

Moreover, the oxide sintered compact of the present invention preferably has a density of 6.10 g/cm$^3$ or more. When the oxide sintered compact of the present invention is used as a sputtering target, superior effects are yielded in that high densification of the sintered compact will increase the uniformity of the sputtered film, and particle generation during sputtering can be significantly reduced.

A representative example of the production method of the oxide sintered compact of the present invention is as follows.

As raw materials, indium oxide ($In_2O_3$), gallium oxide ($Ga_2O_3$), and zinc oxide (ZnO) are prepared. In order to avoid the adverse effects on the electrical properties caused by impurities, it is desirable to use raw materials having a purity of 4N or higher. The respective raw materials are weighed to achieve a predetermined compositional ratio. Note that these raw materials contain unavoidable impurities.

Next, the respective raw materials are mixed so that the oxide sintered compact is to have a predetermined compositional ratio. If the mixing is insufficient, the respective components in the target may become segregated and cause an abnormal discharge such as arcing, or cause particle generation during the sputtering. Thus, the mixing is preferably performed sufficiently. Furthermore, by subjecting the mixed powder to pulverization and granulation, it is possible to improve the moldability and sinterability of the mixed powder, and thereby obtain a high-density sintered compact. As the means for performing the mixing and pulverization processes, for instance, a commercially available mixer, ball mill, beads mill or the like may be used, and as the means for the granulation process, for instance, a commercially available spray drier may be used.

Next, the mixed powder is filled in a mold, and subject to uniaxial pressing under the following conditions; specifically, a surface pressure of 400 to 1000 kgf/cm$^2$, and a holding time of 1 to 3 minutes, to obtain a green compact. When the surface pressure is less than 400 kgf/cm$^2$, it is not possible to obtain a green compact having a sufficient density. Moreover, even if excessive surface pressure is applied, the density of the green compact hardly increases beyond a certain level, and a density distribution tends to become generated in the green compact in principle when being subject to uniaxial pressing, and causes deformation and cracks during sintering. Thus, a surface pressure of 1000 kgf/cm$^2$ or more is not particularly required for production.

Next, this green compact is subject to double vacuum packing in vinyl, and subject to CIP (cold isostatic pressing) under the following conditions; specifically, a pressure of 1500 to 4000 kgf/cm$^2$, and a holding time of 1 to 3 minutes. When the pressure is less than 1500 kgf/cm$^2$, it is not possible to obtain a sufficient effect of CIP. Meanwhile, even if pressure of 4000 kgf/cm$^2$ or more is applied, the density of the green compact hardly increases beyond a certain level, and therefore, a surface pressure of 4000 kgf/cm$^2$ or more is not particularly required for production.

Next, the green compact is subject to sintering at a temperature of 1300 to 1430° C. and a holding time of 10 to 24 hours in an air atmosphere or an oxygen atmosphere to obtain a sintered compact. The sintering temperature of lower than 1300° C. is undesirable since oxygen becomes less eliminated from the sintered compact, the oxygen defect concentration will deteriorate, and the carrier concentration will deteriorate (that is, the bulk resistance will increase). Meanwhile, when the sintering temperature is 1430° C. or higher, the size of the crystal grains in the sintered compact becomes too large, and the mechanical strength of the sintered compact may deteriorate. Moreover, when the holding time is less than 10 hours, it is not possible to obtain a sintered compact having a sufficient density, and, when the holding time is longer than 24 hours, this is undesirable from the perspective of production cost.

Moreover, in the molding/sintering processes, HP (hot pressing) and HIP (hot isostatic pressing) may be used other than the foregoing methods. The sintered compact obtained as described above is processed into a target shape via machining such as grinding and/or polishing to obtain a sputtering target. Note that, upon preparing an oxide semiconductor film, the sputtering target obtained as described above is sputtered under predetermined conditions to deposit a film, and, as needed, the deposited film is subject to annealing at a predetermined temperature to obtain an oxide semiconductor film.

In the present invention, the flexural strength is measured based on a three-point bending test in accordance with JISR1601:2008 (titled "Testing Method for Flexural Strength (Modulus of Rupture) of Fine Ceramics at Room Temperature"). Specifically, the measurement is performed using ten samples having dimensions, in which the total length is 40 mm L 0.1 mm, the width is 4 mm±0.1 mm, and the thickness is 3 mm±0.1 mm, at a span between supports of 30 mm f 0.1 mm, and a crosshead speed of 0.5 mm/min, and the measurement results are averaged.

For obtaining the average grain size, samples are extracted from a total of five locations; specifically, a part near the center and the four corners of a rectangular plate-shaped target. For each sample, a 300×SEM image is produced by scanning an arbitrary cross-section surface of the target, five straight lines are drawn on the image to obtain code lengths by measuring the length in which each straight line intersects with the crystal grains, these code lengths are averaged, and a value obtained by multiplying the average value by a coefficient of 1.78 is used as the crystal grain size.

Moreover, the sintered compact density and the bulk resistance are obtained, for each of the samples extracted from a total of five locations; specifically, a part near the center and the four corners of a rectangular plate-shaped target, by measuring the sintered compact density by the Archimedean method and the bulk resistance by the four probe method, and respectively calculating the average values by dividing the measurement results by the number of measurement locations.

EXAMPLES

The present invention is now explained based on Examples and Comparative Examples. Note that the following Examples are merely illustrative, and the present invention is not limited to such Examples. In other words, the present invention is limited only based on the scope of claims, and the present invention also covers the other modes and modifications included therein.

Example 1

An $In_2O_3$ powder, a $Ga_2O_3$ powder, and a ZnO powder were weighed so that the compositional ratio of the sintered compact becomes 1.00:1.00:1.01 in terms of an atomic ratio of In, Ga and Zn, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm$^2$ to obtain a green compact. Next, the obtained green compact was subject to double vacuum packing in vinyl, and CIP (cold isostatic pressing) at 1500 to 4000 kgf/cm$^2$, and thereafter sintered in an oxygen atmosphere at a temperature of 1430° C. for 20 hours.

The flexural strength of the thus obtained IGZO sintered compact was 55 MPa and the bulk resistance was 36.0 mΩcm, and it was possible to obtain an IGZO sintered compact having a high mechanical strength and a low resistance. Moreover, the average grain size of the sintered compact was 20.8 μm and the density was 6.3 g/cm$^3$, and a high-density IGZO sintered compact was obtained. The foregoing results are shown in Table 1.

TABLE 1

| | Sintering temperature (° C.) | Sintering time (h) | Sintered compact composition (atomic ratio) | | | Crystal grain size (μm) | Density (g/cm$^3$) | Flexural Strength (MPa) | Bulk density (mΩcm) |
|---|---|---|---|---|---|---|---|---|---|
| | | | In | Ga | Zn | | | | |
| Comparative Example 1 | 1430 | 20 | 1.00 | 1.00 | 1.00 | 35.9 | 6.33 | 33 | 35 |
| Example 1 | 1430 | 20 | 1.00 | 1.00 | 1.01 | 20.8 | 6.32 | 55 | 36 |
| Example 2 | 1430 | 20 | 1.00 | 1.00 | 1.02 | 18.3 | 6.33 | 57 | 36 |
| Example 3 | 1430 | 20 | 1.00 | 1.00 | 1.05 | 14.0 | 6.26 | 63 | 27 |
| Example 4 | 1430 | 20 | 1.00 | 1.00 | 1.10 | 9.9 | 6.33 | 87 | 23 |
| Comparative Example 2 | 1430 | 5 | 1.00 | 1.00 | 1.02 | 5.5 | 6.01 | 38 | 40 |
| Example 5 | 1350 | 10 | 1.00 | 1.00 | 1.00 | 14.4 | 6.34 | 60 | 82 |
| Example 6 | 1350 | 10 | 1.00 | 1.00 | 1.02 | 10.7 | 6.34 | 77 | 60 |
| Comparative Example 3 | 1300 | 20 | 1.00 | 1.00 | 1.00 | 18.4 | 6.34 | 54 | 118 |
| Example 7 | 1300 | 20 | 1.00 | 1.00 | 1.01 | 11.1 | 6.34 | 80 | 92 |
| Example 8 | 1300 | 20 | 1.00 | 1.00 | 1.02 | 10.9 | 6.35 | 86 | 83 |
| Example 9 | 1300 | 20 | 1.00 | 1.00 | 1.05 | 8.5 | 6.35 | 152 | 58 |
| Example 10 | 1300 | 20 | 1.00 | 1.00 | 1.10 | 6.2 | 6.32 | 167 | 47 |
| Comparative Example 4 | 1250 | 20 | 1.00 | 1.00 | 1.00 | 11.6 | 6.32 | 85 | 203 |
| Comparative Example 5 | 1250 | 20 | 1.00 | 1.00 | 1.01 | 8.5 | 6.32 | 162 | 123 |
| Comparative Example 6 | 1250 | 20 | 1.00 | 1.00 | 1.02 | 7.6 | 6.30 | 144 | 139 |
| Comparative Example 7 | 1250 | 20 | 1.00 | 1.00 | 1.05 | 5.9 | 6.20 | 140 | 131 |
| Comparative Example 8 | 1250 | 20 | 1.00 | 1.00 | 1.10 | 5.3 | 6.09 | 110 | 143 |

Examples 2 to 4, Comparative Example 1

An $In_2O_3$ powder, a $Ga_2O_3$ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1430° C. for 20 hours.

The IGZO sintered compacts obtained under the conditions of Examples 2 to 4 all had a flexural strength of 50 MPa or more and a bulk resistance of 100 mΩcm or less, and it was possible to obtain IGZO sintered compacts having a high mechanical strength and a low resistance. Moreover, the average grain size of the sintered compacts was 22 μm or less and the density was 6.10 g/cm³ or more, and high-density IGZO sintered compacts were obtained. Meanwhile, the IGZO sintered compact obtained under the conditions of Comparative Example 1 had a low bulk resistance, but exhibited a low flexural strength value of 33 MPa.

Examples 5 and 6

An $In_2O_3$ powder, a $Ga_2O_3$ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1350° C. for 10 hours.

The IGZO sintered compacts obtained under the conditions of Examples 5 and 6 all had a flexural strength of 50 MPa or more and a bulk resistance of 100 mΩcm or less, and it was possible to obtain IGZO sintered compacts having a high mechanical strength and a low resistance. Moreover, the average grain size of the sintered compacts was 22 μm or less and the density was 6.10 g/cm³ or more, and high-density IGZO sintered compacts were obtained.

Examples 7 to 10, Comparative Example 3

An $In_2O_3$ powder, a $Ga_2O_3$ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1300° C. for 20 hours.

The IGZO sintered compacts obtained under the conditions of Examples 7 to 10 all had a flexural strength of 50 MPa or more and a bulk resistance of 100 mΩcm or less, and it was possible to obtain IGZO sintered compacts having a high mechanical strength and a low resistance. Moreover, the average grain size of the sintered compacts was 22 μm or less and the density was 6.10 g/cm³ or more, and high-density IGZO sintered compacts were obtained. Meanwhile, the IGZO sintered compact obtained under the conditions of Comparative Example 3 had a high transverse intensity, but exhibited a high bulk resistance value in excess of 100 mΩcm.

Comparative Examples 4 to 8

An $In_2O_3$ powder, a $Ga_2O_3$ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1250° C. for 20 hours. The IGZO sintered compacts obtained under the conditions of Comparative Examples 4 to 8 all had a high flexural strength, but exhibited a high bulk resistance value in excess of 100 mΩcm. Moreover, while the sintered compacts of Comparative Examples 7 and 8 had a small crystal grain size, numerous pores were observed in the sintered compacts.

Comparative Example 2

An $In_2O_3$ powder, a $Ga_2O_3$ powder, and a ZnO powder were weighed so that the compositional ratio of the sintered compact becomes an atomic ratio of In, Ga and Zn indicated in Table 1, and these powders were mixed and pulverized based on a wet process, and subsequently dried and granulated with a spray drier to obtain a mixed powder. Next, the mixed powder was subject to uniaxial pressing at a surface pressure of 400 to 1000 kgf/cm² to obtain a green compact. Next, the obtained green compact was subject to double vacuum packing in vinyl, and CIP at 1500 to 4000 kgf/cm², and thereafter sintered in an oxygen atmosphere at a temperature of 1430° C. for 5 hours. While the obtained IGZO sintered compact had a small crystal grain size, there were numerous pores in the sintered compact, and, when used as a target, there was concern of the generation of arcing or particles during sputtering.

The relation of flexural strength and bulk resistance of the IGZO sintered compacts in the foregoing Examples and Comparative Examples is shown in the FIGURE. By appropriately adjusting the sintered compact composition and the sintering temperature, it was possible to prepare sintered compacts having a flexural strength of 50 MPa or more and a balk resistance of 100 mΩcm or less as shown in the FIGURE.

The oxide sintered compact of the present invention can be used to form a sputtering target capable of realizing both a high flexural strength and a low bulk resistance. This target is free from cracks and has limited generation of particles when subject to DC sputtering, and thus it is possible to form high quality thin films. By using this kind of sputtering target, it is possible to yield a superior effect of being able to stably mass-produce oxide semiconductor films and the like. The oxide semiconductor film of the present invention is particularly useful as an active layer of TFT in a backplane of a flat-panel display or a flexible panel display.

The invention claimed is:
1. An IGZO sintered compact composed of indium (In), gallium (Ga), zinc (Zn), oxygen (O) and unavoidable impurities, wherein the IGZO sintered compact has a flexural strength of 50 MPa or more, a bulk resistance of 23 mΩcm or more and 100 mΩcm or less, and a density of 6.26 g/cm³ or more, and an atomic ratio of In, Ga, and Zn satisfies the following formulae:

$0.314 \leq \text{In}/(\text{In}+\text{Ga}+\text{Zn}) \leq 0.342$;

$0.314 \leq \text{Ga}/(\text{In}+\text{Ga}+\text{Zn}) \leq 0.342$; and $0.325 \leq \text{Zn}/(\text{In}+\text{Ga}+\text{Zn}) \leq 0.364$.

2. The IGZO sintered compact according to claim 1, wherein the IGZO sintered compact has an average crystal grain size of 6 to 22 µm.

3. A plate-shaped or cylindrical sputtering target formed from the IGZO sintered compact according to claim 1.

* * * * *